United States Patent
Kosednar, Jr.

(10) Patent No.: US 11,290,117 B1
(45) Date of Patent: Mar. 29, 2022

(54) LOW-FREQUENCY ARITHMETIC MULTIPLYING PLL FOR HDL DEVICES

(71) Applicant: Joseph Frank Kosednar, Jr., St. Louis, MO (US)

(72) Inventor: Joseph Frank Kosednar, Jr., St. Louis, MO (US)

(73) Assignee: Joseph Kosednar, Jr., St. Louis, MO (US)

( * ) Notice: Subject to any disclaimer, the term of this patent is extended or adjusted under 35 U.S.C. 154(b) by 0 days.

(21) Appl. No.: 17/457,162

(22) Filed: Dec. 1, 2021

(51) Int. Cl.
*H03L 7/08* (2006.01)
*H03L 7/181* (2006.01)

(52) U.S. Cl.
CPC ............... *H03L 7/181* (2013.01); *H03L 7/08* (2013.01)

(58) Field of Classification Search
None
See application file for complete search history.

(56) References Cited

U.S. PATENT DOCUMENTS

| | | | |
|---|---|---|---|
| 4,906,941 A | 3/1990 | Kato et al. | |
| 5,289,141 A | 2/1994 | Nanni et al. | |
| 5,592,129 A | 1/1997 | Fried et al. | |
| 5,808,493 A | 9/1998 | Akiyama et al. | |
| 7,298,790 B2 | 11/2007 | Craninckx | |
| 7,453,323 B2 | 11/2008 | Takahashi | |
| 7,849,339 B2 | 12/2010 | Lee | |
| 8,050,375 B2 | 11/2011 | Staszewski et al. | |
| 8,907,706 B2 | 12/2014 | Mitric et al. | |
| 9,571,109 B2 | 2/2017 | Friend et al. | |
| 10,784,871 B1 | 9/2020 | Xanthopoulos et al. | |
| 10,789,333 B2 | 9/2020 | Nakajima | |

(Continued)

FOREIGN PATENT DOCUMENTS

WO    9706600 A1    2/1997

OTHER PUBLICATIONS

Biereigel, S., Kulis, S., Moreira, P., Prinzie, J., Leroux, P., & Koelpin, A. (2020). "Methods for clock signal characterization using FPGA resources." Journal of Instrumentation, 15(03). https://doi.org/10.1088/1748-0221/15/03/p03012.

(Continued)

*Primary Examiner* — Cassandra F Cox

(57) ABSTRACT

A high-density logic circuit device low-frequency phase-locked loop system includes a digital logic input-output module; an internal clock; an instant-lock module; an instant-adjust error module; a high-speed count comparator; a multiplication factor-is-zero-state detect module with a reset function; a pulse generator; and a high-speed pulse generator. The high-speed count comparator includes a high-speed counter and a high-speed comparator. The input-output module receives an input frequency and transmits an output frequency. The instant lock module locks the output frequency in phase to a leading edge the input frequency within two internal propagation delays. The instant-adjust error module emits a pulse request until a last pulse is identified. The high-speed count comparator receives the pulse request and emits the output frequency. The pulse generators receive the input frequency and internal clock pulses and output a frequency-in pulse. The HDL device has a digital low-frequency PLL function without the use of external components.

11 Claims, 14 Drawing Sheets

(56) References Cited

U.S. PATENT DOCUMENTS

| | | | | |
|---|---|---|---|---|
| 10,868,551 | B1* | 12/2020 | Schat | H03L 7/0992 |
| 10,911,056 | B2 | 2/2021 | Staszewski et al. | |
| 2005/0127961 | A1* | 6/2005 | Ngo | H03L 7/183 |
| | | | | 327/156 |
| 2007/0047690 | A1 | 3/2007 | Zhao et al. | |
| 2010/0141310 | A1 | 6/2010 | Yu et al. | |
| 2021/0119618 | A1 | 4/2021 | Wei et al. | |

OTHER PUBLICATIONS

Yi, Yue "FPGA Implementation of Impedance-Compensated Phase-Locked Loop." The University of Manitoba, Winnipeg, Manitoba, Canada, Feb. 2019, pp. i-109.

Sridharan, D., and P. Meenakshi vidya. "FPGA Implementation of Digitized Phase-Locked Loop With Tolerance to PVT Variations." International Journal of Scientific & Engineering Research, vol. 6, No. 4, Apr. 2015, pp. 341-344.

Khan, Tanvir Zaman, et al. "FPGA Implementation of Phase Locked Loop (PLL) with Synchronous Reset." International Journal of Electrical, Electronics and Data Communication, ISSN: 2320-2084, vol. 2, No. 8, Aug. 2014, pp. 1-4.

Tso, Dustin, et al. "High Resolution Phase Difference Detector Using Digital Dual Mixer Timing Design (D-DMTD) with FPGA." High Resolution Phase Difference Detector Using Digital Dual Mixer Timing Design (D-DMTD) with FPGA. (Conference) | OSTI.GOV, Sep. 1, 2017.

"ORCA Series 4 FPGA PLL Elements," Technical Note TN1014. Lattice Semiconductor Corporation, Sep. 2004.

Jackson, D. J. "Digital Systems Design—Clock Networks and Phase Lock Loops on Altera Cyclone V Devices." University of Alabama, http://jjackson.eng.ua.edu/courses/ece480/lectures/LECT09.pdf.

Kumm, Martin & Klingbeil, Harald & Zipf, P.. (2010). "An FPGA-based linear all-digital phase-locked loop." Circuits and Systems I: Regular Papers, IEEE Transactions on. 57. 2487-2497. 10.1109/TCSI.2010.2046237.

Parvereshi, Jehangir, and Sassan Tabatabaei. "Enhancing FPGA-based Systems with Programmable Oscillators."

"Introduction to FPGA-based ADPLLs", Application note AN575 Rev. 0.1 Mar. 11, 2011.

Devi, T. Kalavathi, and Sakthivel, P. "A Design of Phase Locked Loop Based Frequency Synthesizer using 4/5 Prescaler Circuit", International Journal of Engineering and Advanced Technology (IJEAT), vol. 8, No. 4, Apr. 2019, pp. 581-586.

Mingqian Yang, Lei Chen, Xuewu Li, and Yanlong Zhang , "A dynamically reconfigurable multi-functional PLL for SRAM-based FPGA in 65nm CMOS technology", AIP Conference Proceedings 1955, 040084 (2018) https://doi.org/10.1063/1.5033748.

Vydehi, Nakkina, and AS Srinivasa Rao. "A Low Power VLSI Design of an All Digital Phase Locked Loop." International Journal of Engineering Trends & Technology 16.6 (2014).

Nadeem, Uzair, et al. "FPGA based Implementation of Frequency and Phase Matching Technique for Grid Tied Applications." arXiv preprint arXiv:1909.06199 (2019).

Hu, Dan. "FPGA-based digital phase-locked loop analysis and implementation." (2011).

Dedic, J., et al. "Extremely low-jitter FPGA based synchronization timing system." 2007 IEEE Particle Accelerator Conference (PAC). IEEE, 2007, pp. 296-298.

"Using FPGAs for Digital PLL Applications", Application Note AC117. Actel Corporation. Apr. 1996, pp. 85-88.

Gaither, Justin L., "A new programmable low noise all digital phase-locked loop architecture" (2005). Retrospective Theses and Dissertations. 18752. https://lib.dr.iastate.edu/rtd/18752.

Ye, Junming, Guangxiang Zhou, and Haiyan Liu. "Design and research of improved digital phase-locked loop based on FPGA." Procedia Engineering 29 (2012): 547-552.

Kovacheva, Marieta, Eltimir Stoumenov, and Ivailo Pandiev. "FPGA Implementation of Digital PLL-based Frequency Synthesizer with Programmable Frequency Dividers." iCEST 2014, pp. 225-228.

"Altera Phase-Locked Loop (Altera PLL) IP Core User Guide," Intel Co., San Jose, CA, 2017.

Von Kaenel, V., Aebischer, D., Piguet, C., & Dijkstra, E. (1996). Abstract, "A 320 mhz, 1.5 mW@1.35 V CMOS PLL for microprocessor clock generation." IEEE Journal of Solid-State Circuits, 31(11), 1715-1722. https://doi.org/10.1109/jssc.1996.542316. Retrieved Nov. 22, 2021, from https://ieeexplore.ieee.org/document/542316.

Holme, A. "38-76 mhz fractional-N synthesizer." (2009). Retrieved Nov. 22, 2021, from http://www.aholme.co.uk/Frac3/Main.htm.

"ADF4106. Datasheet and Product Info" | Analog Devices. (n.d.). Retrieved Nov. 22, 2021, from https://www.analog.com/en/products/adf4106.html.

Benjamin Crawford "Achieving low-frequency clocks in FPGA fabric when below what PLL can provide." Electrical Engineering Stack Exchange. (2021) Retrieved Nov. 22, 2021, from https://electronics.stackexchange.com/questions/547222/achieving-low-frequency-clocks-in-fpga-fabric-when-below-what-pll-can-provide.

"Building a simple logic PLL." Gisselquist Technology, LLC (Dec. 14, 2017). Retrieved Nov. 22, 2021, from https://zipcpu.com/dsp/2017/12/14/logic-pll.html.

"Cascading PLL counters to achieve synthesized clock frequencies", Intel FPGA—youtube. (2015). Retrieved Nov. 22, 2021, from https://www.youtube.com/walch?v=T4FWna3-gl8.

"Digital PLL, all digital PLL, analog PLL." Movellus. (Apr. 11, 2021). Retrieved Nov. 22, 2021, from https://www.movellus.com/all-digital-pll-phase-locked-loop/.

Gude, M., et al., "Fully Digital implemented phase locked loop." Design And Reuse, (n.d). Retrieved Nov. 22, 2021, from https://www.design-reuse.com/articles/16212/fully-digital-implemented-phase-locked-loop.html.

Jairo Andres Velasco Romero "How does a PLL inside a FPGA work?" Electrical Engineering Stack Exchange. Retrieved Nov. 22, 2021, from https://electronics.stackexchange.com/questions/14667/how-does-a-pll-inside-a-fpga-work.

"Digital Implementation of Phase Locked Loop on FPGA." ukdiss.com. 11 2018. All Answers Ltd. 11 2021 <https://ukdiss.com/examples/digital-implementation-of-phase-locked-loop.php?vref=1>.

"PLL Phase locked loop tutorial & primer." Electronics Notes. Retrieved Nov. 22, 2021, from https://www.electronics-notes.com/articles/radio/pll-phase-locked-loop/tutorial-primer-basics.php.

"Phase Locked Loop (PLL) Synthesizer & Translation Loop" | Analog Devices. (n.d.). Retrieved Nov. 22, 2021, from https://www.analog.com/en/products/clock-and-timing/phase-locked-loop.html.

"Pll [step FPGA]." https://www.stepfpga.com. (n.d.). Retrieved Nov. 22, 2021, from https://www.stepfpga.com/doc/pll.

Radhapuram, Saichandrateja, Takuya Yoshihara, and Toshimasa Matsuoka. "Design and emulation of all-digital phase-locked loop on FPGA." Electronics 8.11 (2019): 1307.

Hirning, F. (Sep. 26, 2014). "Improve FPGA communications interface clock jitters with external plls." Embedded.com. Retrieved Nov. 22, 2021, from https://www.embedded.com/improve-fpga-communications-interface-clock-jitters-with-external-plls/.

"What is an FPGA? field programmable gate array." Xilinx, (n.d.). Retrieved Nov. 22, 2021, from https://www.xilinx.com/products/silicon-devices/fpga/what-is-an-fpga.html.

Wikimedia Foundation. (Sep. 18, 2021). "Phase-locked loop." Wikipedia. Retrieved Nov. 22, 2021, from https://en.wikipedia.org/wiki/Phase-locked_loop.

"What are the most common uses for FPGA today?"—quora. (n.d ). Retrieved Nov. 22, 2021, from https://www.quora.com/What-are-the-most-common-uses-for-FPGA-today.

Tarun Agarwal "Know about FPGA architecture and thier applications." ElProCus. Retrieved Nov. 22, 2021, from https://www.elprocus com/fpga-architecture-and-applications/.

* cited by examiner

LOW-FREQUENCY ARITHMETIC MULTIPLYING PLL FOR HDL DEVICES

BACKGROUND OF THE INVENTION

The present invention relates to high-density logic devices and, more particularly, to low-frequency phase-locked loops therefor.

High-density Logic (HDL) devices currently have phase-locked loops (PLLs) that work at high frequency (e.g., about 50 megahertz [MHz]+) or use external components to perform the PLL function. HDL devices currently on the market do not have low-frequency PLLs which are needed for work with low-frequency work like with line voltages.

Current HDL device PLLs cannot work at low frequencies needed in many HDL applications, such as 50-60 Hz. Current HDL device PLLs only work at high frequencies and cannot provide low-frequency PLL functions.

As can be seen, there is a need for a low frequency phase-locked loop functionality in a high-density logic device.

SUMMARY OF THE INVENTION

The present invention enables HDL devices to have a digital low-frequency PLL function without the use of external components using only digital logic of the HDL device itself.

The inventive digital circuit may be used for anything that has an HDL device and controls slow speed input/output (I/O) for which a multiplying low-frequency phase-locked loops (LFPLL) is desirable. Industrial, commercial, and residential applications may include industrial automation, automotive sensing and control, medical uses, and motor control.

In one aspect of the present invention, a high-density logic circuit device low-frequency phase-locked loop system is provided. The system includes a digital logic input-output module operative to receive an input frequency and to transmit an output frequency; an internal clock; an instant lock module connected to the digital logic input-output module and operative to lock the output frequency in phase to a leading edge the input frequency within two internal propagation delays; an instant adjust error module connected to the digital logic input-output module and operative to emit a pulse request until a last pulse is identified; a high-speed count comparator comprising a high-speed counter and a high-speed comparator, said high-speed count comparator connected to the digital logic input-output module and the instant adjust error module and operative to receive the pulse request and to emit the output frequency; a multiplication factor-is-zero-state detect module connected to the instant lock module and the high-speed count comparator, said multiplication factor-is-zero-state detect module having a reset function; a pulse generator connected to the digital logic input-output module, the instant lock module, and the instant adjust error module, and operative to receive the input frequency and internal clock pulses and to output a frequency-in pulse to the instant lock module and the instant adjust error module; and a high-speed pulse generator connected to the digital logic input-output module, the high-speed count comparator, the instant lock module, and the instant adjust error module, and operative to receive the input frequency and the internal clock pulses and to output a high-speed frequency-in pulse to the high-speed count comparator, the instant lock module, and the instant adjust error module.

In another aspect of the present invention, a method of performing a low-frequency phase-locked loop with a high-density logic device is provided comprising receiving a binary multiplier value; receiving an input frequency; generating a reference clock signal; generating a high-speed pulse responsive to a first leading edge of the input frequency and to the reference clock signal; locking an output frequency to the first leading edge of the input frequency within two internal propagation delays; counting reference clock signals between the first leading edge of the input frequency and a second leading edge of the input frequency; latching the binary multiplier value; dividing the counted reference clock signals by the latched binary multiplier value to produce a quotient and a remainder; generating a pulse request from the quotient and the remainder; generating output pulses; counting the output pulses and comparing the count to the pulse request; and toggling a flip-flop when the count is equal to or greater than the pulse request.

These and other features, aspects and advantages of the present invention will become better understood with reference to the following drawings, description, and claims.

DETAILED DESCRIPTION OF THE INVENTION

Figure 1:
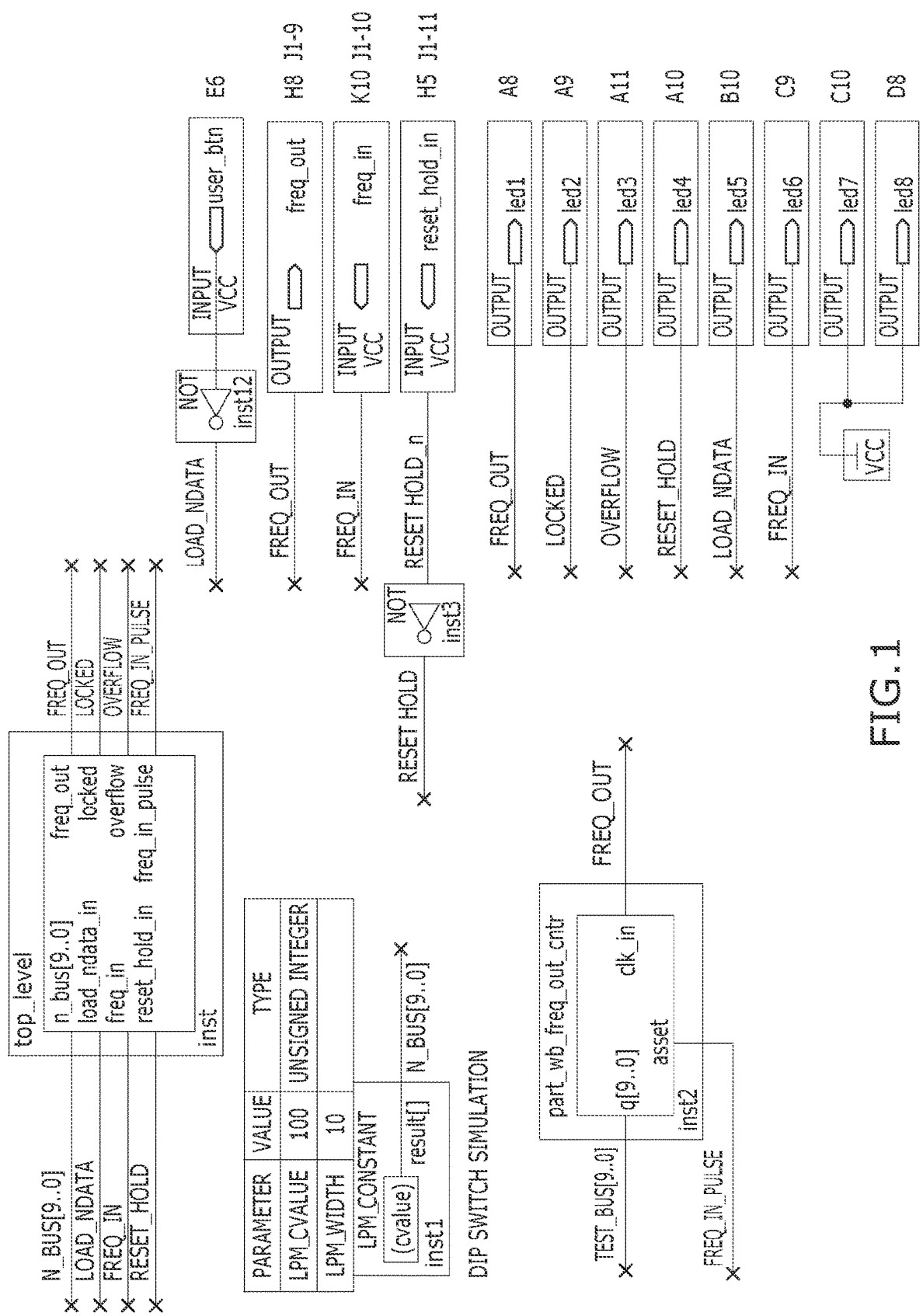
FIG. 1 is a schematic diagram of a workbench level of circuit architecture according to an embodiment of the present invention.

The following detailed description is of the best currently contemplated modes of carrying out exemplary embodiments of the invention. The description is not to be taken in a limiting sense but is made merely for the purpose of illustrating the general principles of the invention, since the scope of the invention is best defined by the appended claims.

Broadly, one embodiment of the present invention is a low-frequency multiplying phase locked loop (LFPLL) circuit especially suited for use in high density logic devices, such as a field-programmable gate array (FPGA). A variable frequency input is multiplied by a constant binary multiplier value N, producing output pulses that are a multiple of the frequency input. In other words, for each incoming pulse, N smaller outgoing pulses are generated. A system clock is provided to clock the LFPLL, generating reference clock signals, internal clock pulses, or internal clock cycles. The multiple N is latched by the LFPLL. Control signals are locked and overflow is generated. The LFPLL counts the number of system clocks that occur between leading edges of frequency input, and the total number of clocks are divided by the value of 2N (i.e., a half-cycle), to calculate a quotient and a remainder. The sum of the quotient and one bit of the remainder create a value equal to the number of system clocks between edges of the output frequency. This value is sent to a count and compare function as a request for the time between output pulses. System clocks are counted until the count equals the requested value, then a flip-flop is toggled. The output of the flip-flop is then routed as frequency output and feedback for the next half-cycle and the cycle repeats.

As used herein, the terms "register" and "latch" are sometimes used interchangeably. Also, the terms "pulse" and "frequency cycle" are sometimes used interchangeably. As used herein, the term "phase locked" refers to locking an input frequency to an output frequency.

The present invention provides a designer access to a low-frequency PLL to synchronize to 50/60 Hz. An HDL alternating current (AC) motor controller with LFPLL enables the user to determine the torque, start ability, and speed at precise firing angles. For example, the LFPLL may count pulses until the firing angle of interest is reached. An insulated-gate bipolar transistor (IGBT) may then fire. Such a device may be used, for example, to precisely control the speed of a low-frequency rotary tool.

The inventive system has several advantages, including a low-frequency instant lock, a minimum footprint (i.e., a low-gate count), a high input/output dynamic range, and multiple RESET/HOLD options. Characteristics may be modified using well known PLL inputs. No high-level functions are required and no random-access memory or read-only memory (RAM/ROM) is necessary.

The system is very portable to other devices and architectures. A person may compile the inventive system, then program an HDL device with the output file(s). The inventive circuit design may be ported to different HDL devices size/density, manufacturer, and language.

Remainder bits continue to add to each half-cycle until all remainder bits are sent. Half-cycles of frequency output are counted until 2N equal count of half-cycles, a blanking pulse is sent to count and compare function. Additional frequency output pulses are blanked, no extra outputs are generated. High speed positive edge of frequency input occurs, the next set of output clocks continue.

Using the high-speed edge of frequency input causes the frequency output to sync to frequency input in nanoseconds, locking the LFPLL. The actual frequency of the system clock and the duty cycle of the frequency input are irrelevant. Any frequency input is between the maximum count before overflow of the frequency input edge to edge counter and a frequency less than 2 cycles of system clock per frequency output pulses may be accepted. The lock time consists of three frequency input cycles:
1. Count system clocks from frequency input edge-to-edge.
2. Calculate a quotient and remainder.
3. Output the correct frequency locked to the leading edge of the input frequency.

The user may configure external signals including the width/value of a multiplier N or a system clock (SYSCLK) frequency.

In some embodiments, the width of BUS's may be expanded or reduced to change the size or speed of the inventive high-density logic circuit device.

In some embodiments, the system may output an overflow signal via a carry out pin (COUT) instead of frequency out (FREQ_OUT). The overflow out signal enables a DFFE which outputs the OVERFLOW signal. FREQ_OUT is a square wave with a flat peak (HI or 1) and a flat trough (LOW or 0). The low corresponds to a carry to the next wave.

Referring to FIGS. 1, 2A, 2B, 3A, 3B, 4A, 4B, 4C, 5A, 5B, and 6 through 8, FIG. 1 illustrates a digital logic "workbench" module, or input-output module. A high-density logic device according to an embodiment of the present invention receives and outputs external signals to control the LFPLL. Input to the workbench includes a load signal to latch "N" data (pin E6), frequency in (pins K10, J1-10), and reset hold (pins H5 and J1-11). A value of "N" is produced from a dip switch simulation module as "N_BUS". After processing through architecture levels, the device outputs a frequency out (pins H8, J1-9). As used herein, modules that start with the prefix "part_" are component logic operative to compile LFPLL. The workbench includes debug and verification modules well known in the art, including a diagnostic "part_wb_freq_out_cntr" module. HDL device operation implementation happens simultaneously and sequentially.

Figure 2A:
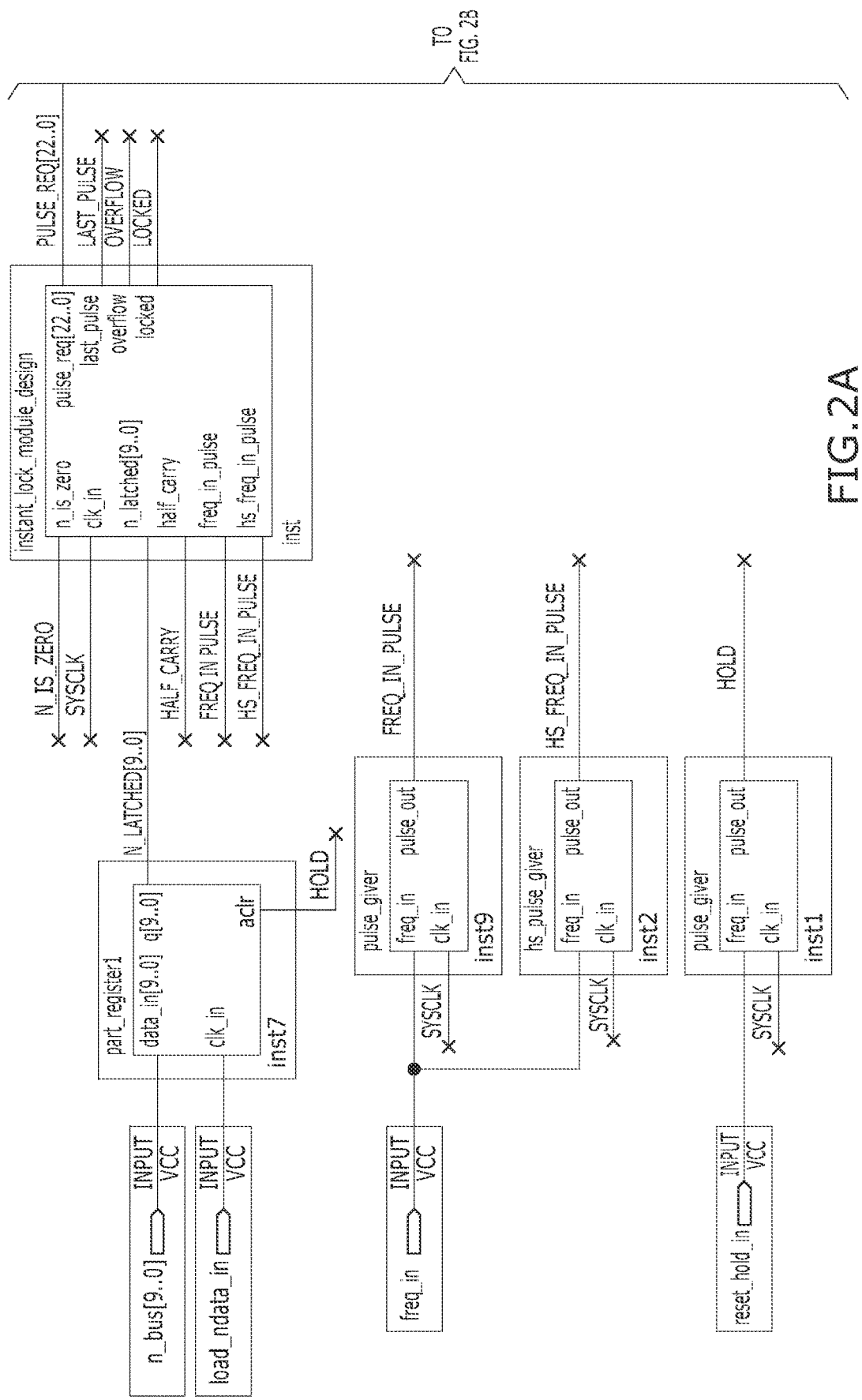
FIG. 2A is a schematic diagram of a top level of the circuit architecture.
Figure 2B:
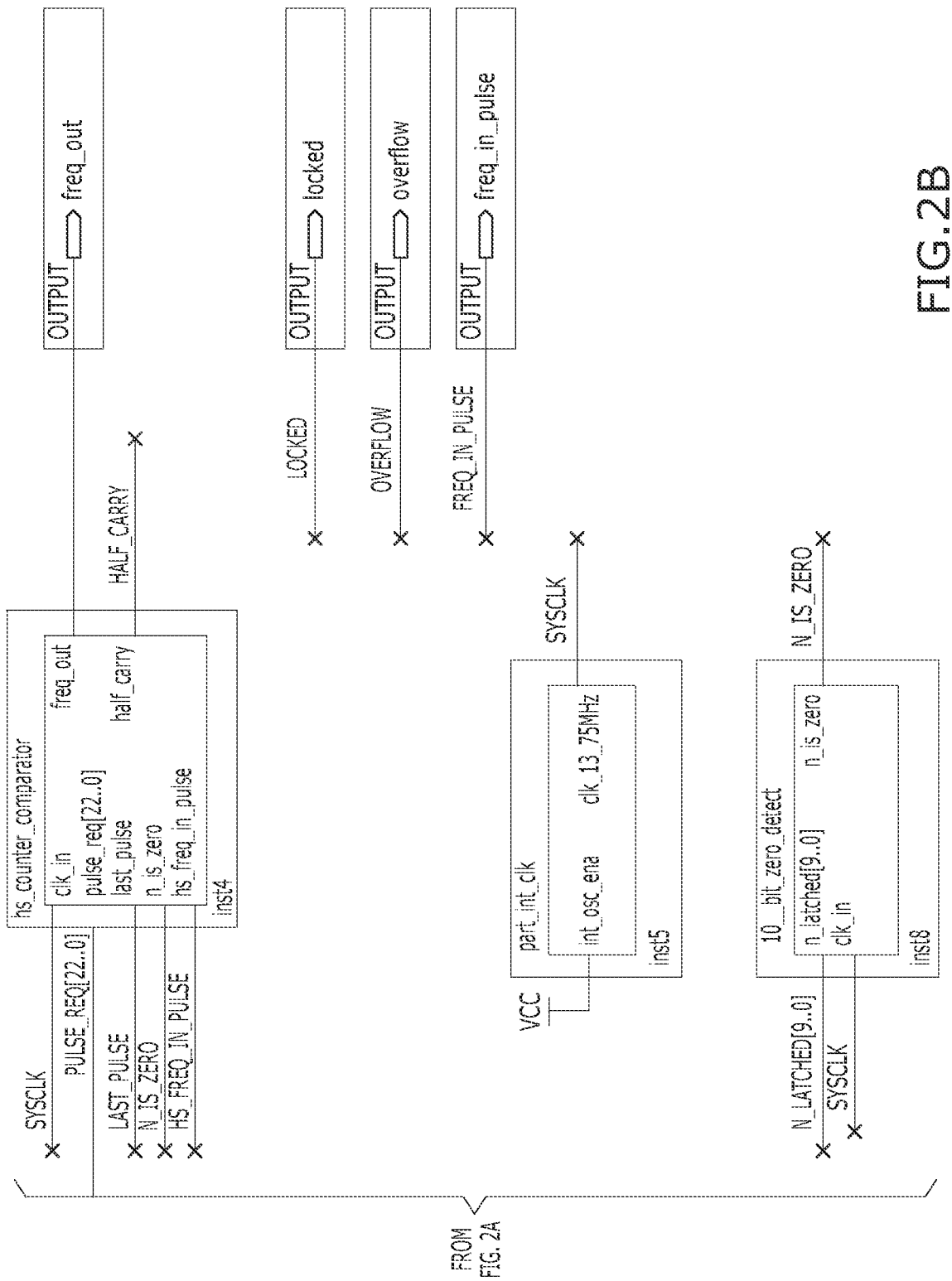
FIG. 2B is a continuation of FIG. 2A.

The workbench communicates with a first level of architecture shown in FIGS. 2A and 2B. N data is loaded from the dip switch simulator in FIG. 1 to a first register (part_register1), which holds the multiplier value N; i.e., it "latches" the N value. An "asynchronous clear" feature zeroes the register when the device is first turned on, setting N=0.

As shown in FIG. 2A, an asynchronous clear input HOLD pulse from a reset pulse generator occurs on the leading edge of an input reset_hold_in, i.e., reset_hold_in transitions from 0 to 1, which is received from external logic, and resets the N_LATCHED value stored by the first register (part_register1), clearing the data such that the multiplier value is zero. An N value may subsequently be loaded and latched.

SYSCLK supplies clocks input for all modules. See FIG. 2B for the internal clock feature.

An instant lock module (instant_lock_module_design) turns on if the N_LATCHED_n[ ] value that is not 0 is received. The instant lock module locks or synchronizes the frequency out to the frequency in, i.e., they are locked in phase, with N×FREQ_IN pulses out. The instant lock module converts the value N_LATCHED plus a system clock (SYSCLK) count into a pulse request (PULSE_REQ: requested SYSCLKs per FREQ_OUT transition) output to a high-speed counter comparator module (hs_counter_comparator).

If the SYSCLK counter exceeds a pre-calculated maximum number of system clocks between input pulses, the module issues an overflow signal (OVERFLOW), i.e., an error signal, telling the external logic that the LFPLL has an overflow condition. The overflow usually indicates the device has received no FREQ_IN (i.e., the frequency is 0) or the FREQ_IN is too slow and does not appear within a predetermined amount of time. The OVERFLOW signal drives led3 shown on FIG. 1, so it may be visually detected. The instant lock module also receives a frequency in pulse and a half carry. Half carry refers to a pulse that occurs on the trailing edge of the input pulse, i.e., half carry divides transitions of frequency out leading edge and trailing edge. The high-speed counter comparator module (hs_counter_comparator) compares the number of counts between each transition of frequency out to the pulse request. Three pulse generators are shown on FIG. 2A: a pulse generator (pulse_giver), a high-speed pulse generator (hs_pulse_giver), and a hold pulse generator (pulse_giver). See FIGS. 7 and 8 for more detail. The pulse generator (pulse-giver) emits a clock pulse at a leading edge of an incoming freq_in. The high-speed pulse generator (hs_pulse_giver) emits a pulse instantaneously, i.e., within two clock cycles, at the leading edge of the freq_in pulse, which issues a pulse enabling the device to lock the output phase to the leading edge of the input phase.

As shown on FIG. 2B, a high-speed counter comparator (hs_counter_comparator) generates a FREQ_OUT transition by counting down the PULSE_REQ value. This module is controlled by N_IS_ZERO (system HOLD/RESET), LAST_ PULSE, and HS_FREQ_IN_PULSE. LAST_PULSE cleans up (i.e., blanks) excess N values (FREQ_OUT transitions), for example when the input frequency changes. HS_FREQ_IN_PULSE makes sure FREQ_IN's leading edge is concurrent with the leading edge of FREQ_IN. HS_FREQ_IN_PULSE clocked by FREQ_IN leading edge and is asynchronous to SYSCLK. That is, instantaneously after the leading edge is detected, the frequency out is exactly synchronized with the frequency of the leading edge of the frequency in. As shown in FIG. 5B, enabled D flip-flop storage device (DFFE) frequency out (FREQ_OUT) toggles from half_carry to FREQ_OUT and is set by HS_FREQ_IN_PULSE.

FIG. 2B also illustrates an internal clock (part_intclk) that generates the system clock SYSCLK pulses and a zero detect (10_bit_zero_detect) that identifies when the last N value is zero. Bit 1 enables the clock. See FIG. 6 for more information. Locked outputs, overflow, and freq_in_pulse are sent to the next level of architecture.

Figure 3A:
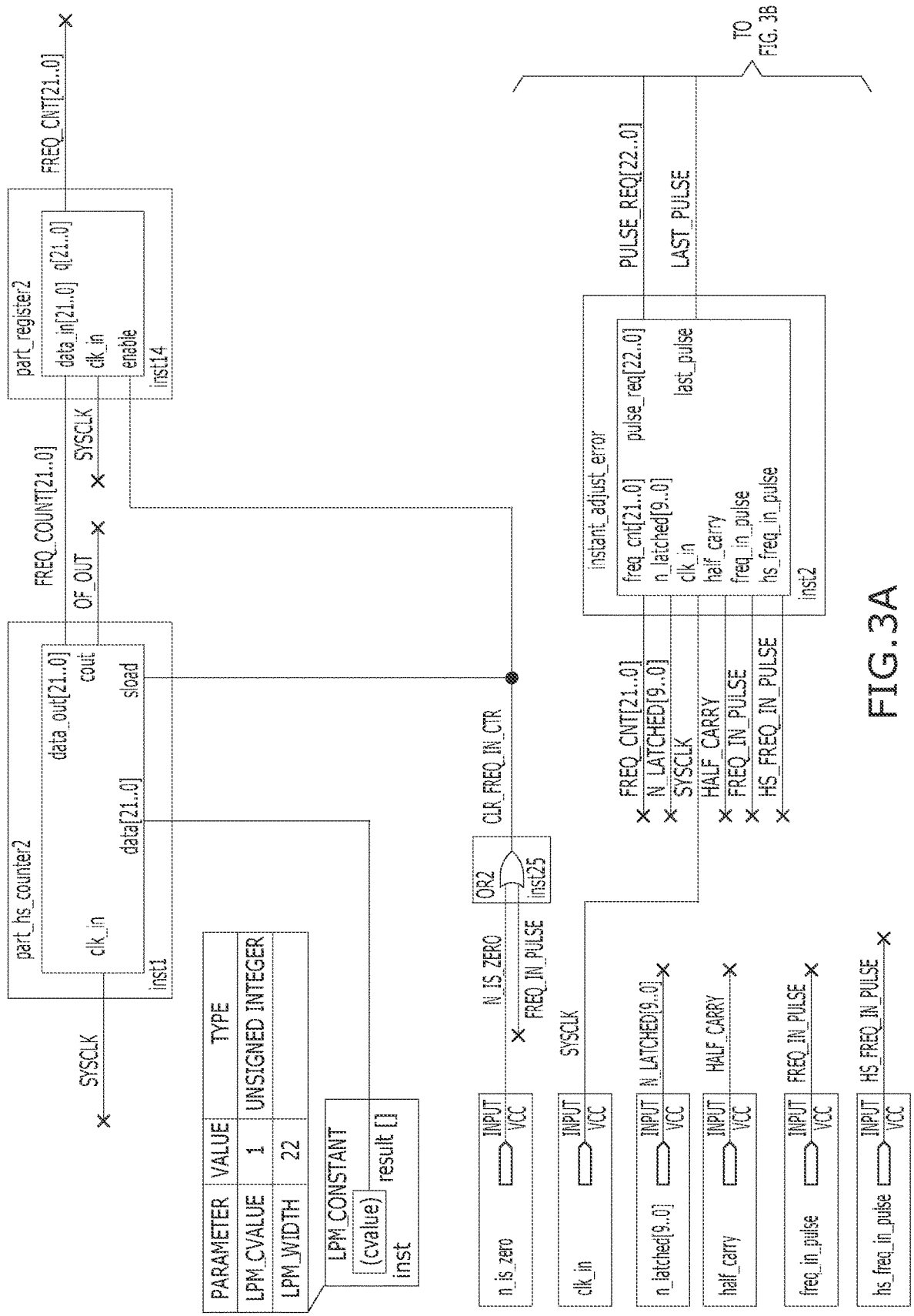
FIG. 3A is a schematic diagram of an instant lock module in a second level of the circuit architecture thereof.
Figure 3B:
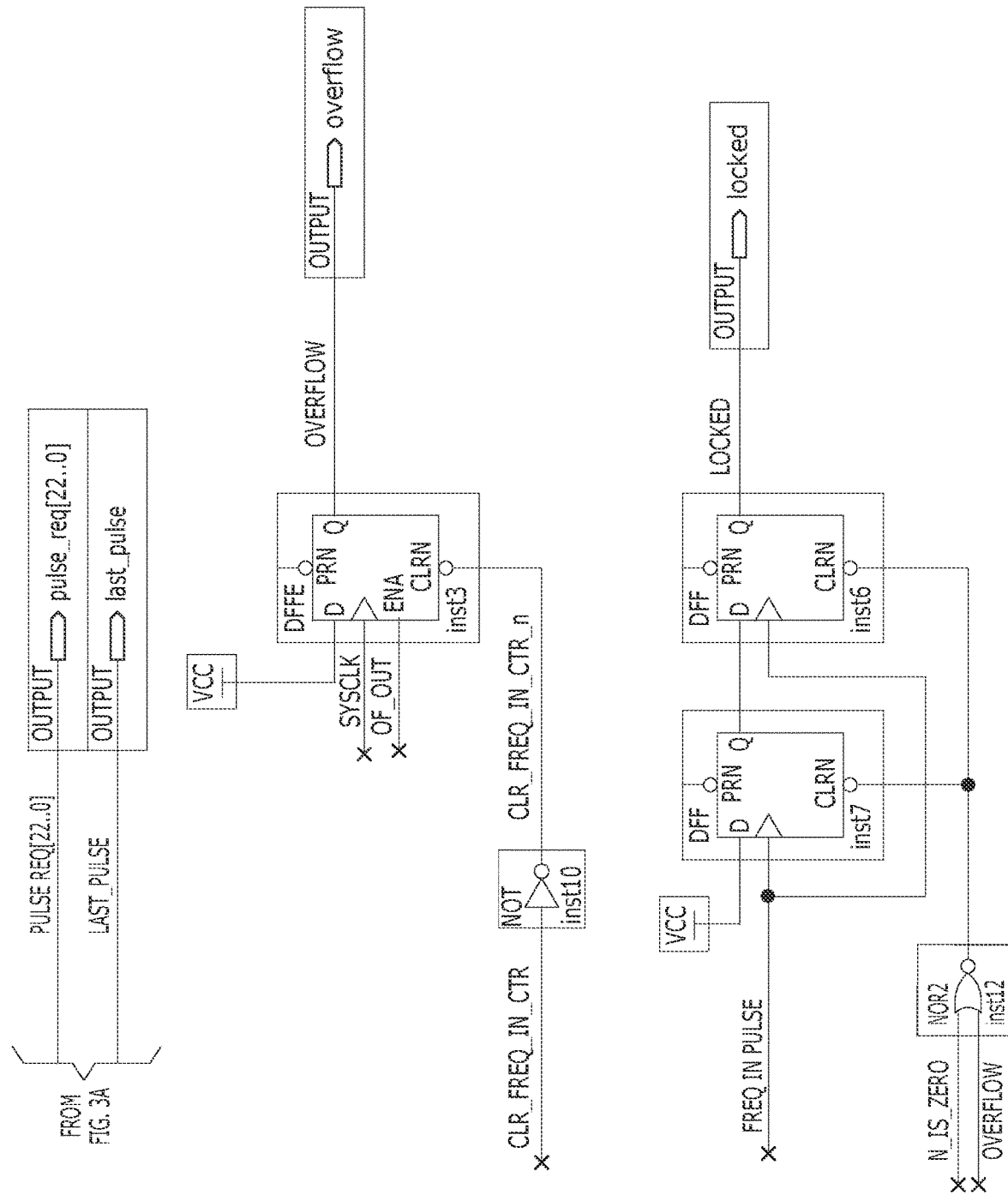
FIG. 3B is a continuation of FIG. 3A.

FIGS. 3A and 3B illustrate a second level of architecture including a second level high-speed counter module (part_hs_counter2), a second register (part_register2), and an instant adjust error module (instant_adjust_error module). The second register (part_register2) latches the second level high-speed counter module's (part_hs_counter2) output. The second level high-speed counter (part_hs_counter2) counts system clock transitions (SYSCLK) incrementally from 1 (provided as a constant) between input pulse (FREQ_IN) leading edges. The second level high-speed counter produces a value of system clocks per input cycle (FREQ_COUNT) which is delivered to a second register (part_register2). When the result overflows, the part outputs OF_OUT. Inputs to an OR gate (OR2) are N_IS_ZERO (HOLD_RESET) and FREQ_IN_PULSE. Gate OR2 via the synchronous load (sload) resets the counter to 1 so that the second level high-speed counter (part_hs_counter2) restarts counting the number of system clocks from the leading edge of a first pulse to the leading edge of a subsequent pulse. The synchronous load (sload) also resets the second level high-speed counter (part_hs_counter2) when the N value is zero (N_IS_ZERO). The second register (part_register2) feeds the system clocks per input pulse (FREQ_CNT) to instant_adjust_error module, which calculates a pulse request (PULSE_REQ), i.e., requested number of system clocks (SYSCLK) per transition cycle, based on FREQ_CNT (count of SYSCLKs between FREQ_IN leading edge to leading edge) and the N_LATCHED multiplier value determined on the first architectural level. The PULSE_REQ is an input to the hs_counter_comparator module, shown in more detail on FIG. 5A.

As on FIGS. 2A and 2B, LAST_PULSE eliminates excess pulses out. FIG. 3B illustrates an overflow enabled D flip-flop storage device DFFE from the high-speed counter which outputs an overflow signal if a maximum number of system clocks has expired with no new leading edge of a pulse. The flip-flop resets by clear frequency in counter (CLR_FREQ_IN_CTR) if a FREQ_IN is detected. FIG. 3B also illustrates a pair of flip-flops from the instant lock module of FIG. 2A. Each flip-flop is clocked by system clock, clocking a binary value of one to Q unless an N=0 or overflow is detected. The system counts two clock pulses (FREQ_IN_PULSE) and outputs the signal LOCKED indicating to the external logic that the LFPLL is locked, as well as indicating visually via led2 shown on FIG. 1. The LFPLL assumes it is locked after two frequency-in pulses. The next cycle the system outputs a sequence of pulses that are a multiple of the instantaneous incoming pulse.

Figure 4A:
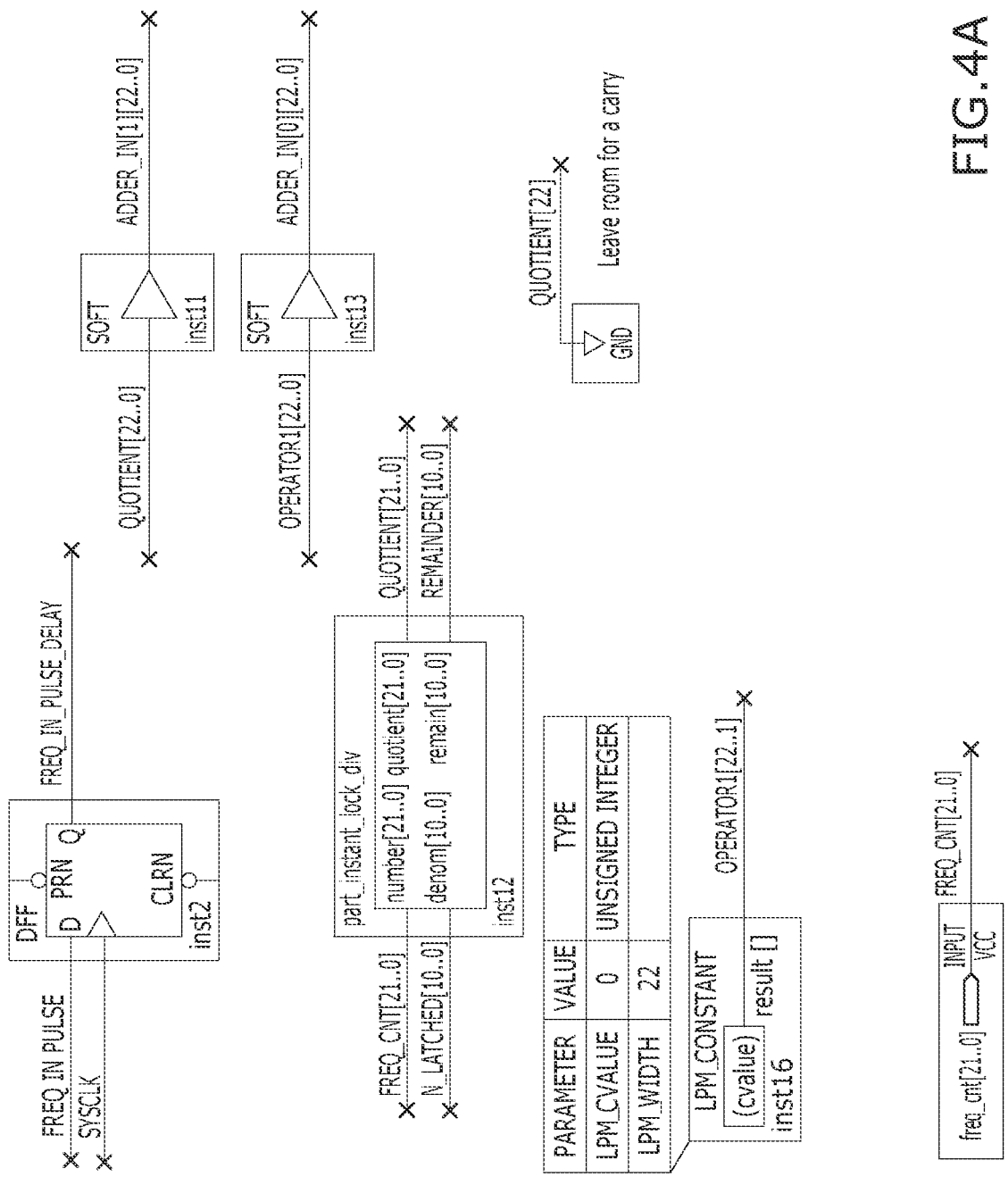
FIG. 4A is a schematic diagram of an instant adjust error module thereof.
Figure 4B:
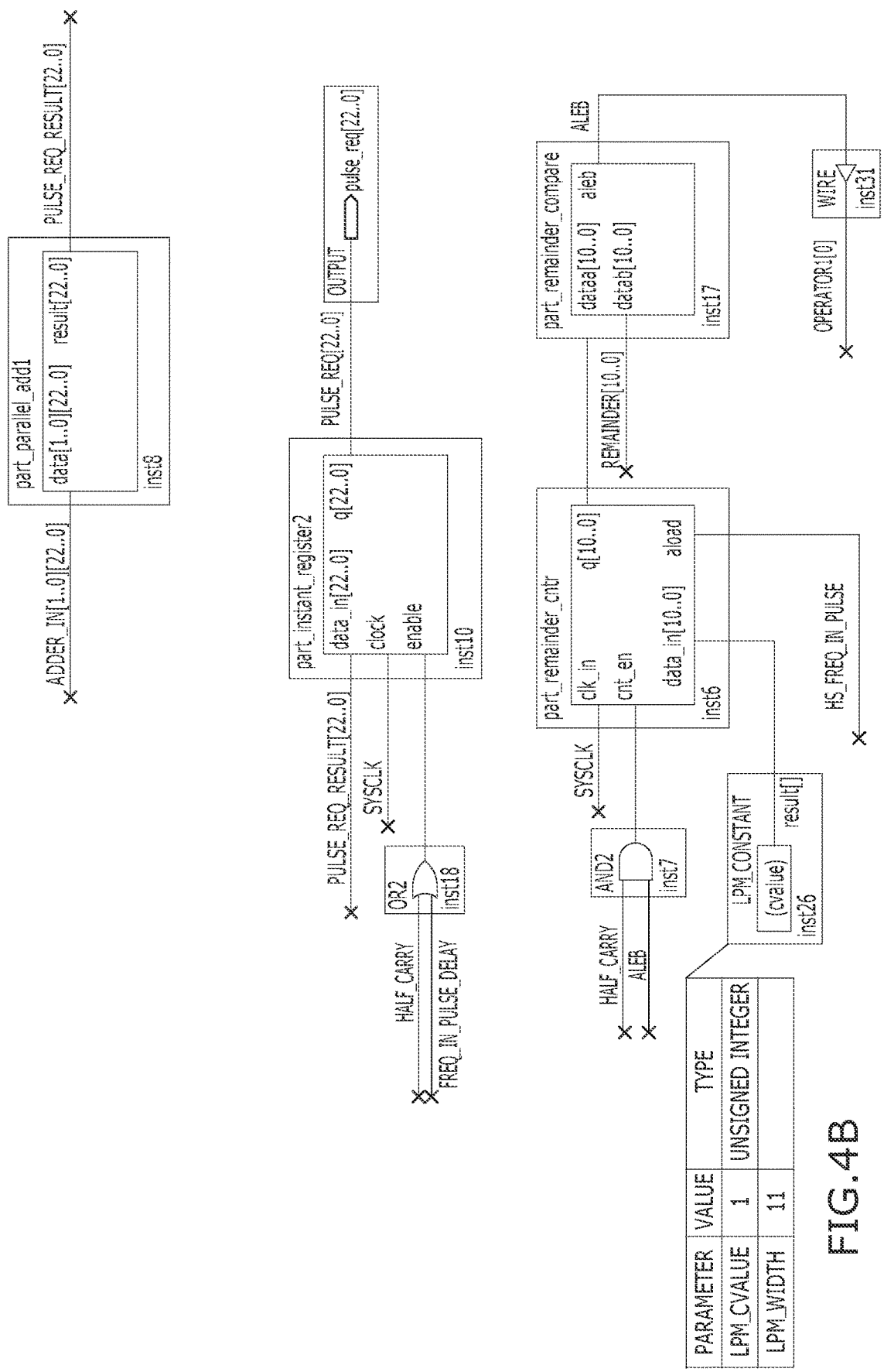
FIG. 4B is a continuation of FIG. 4A.
Figure 4C:
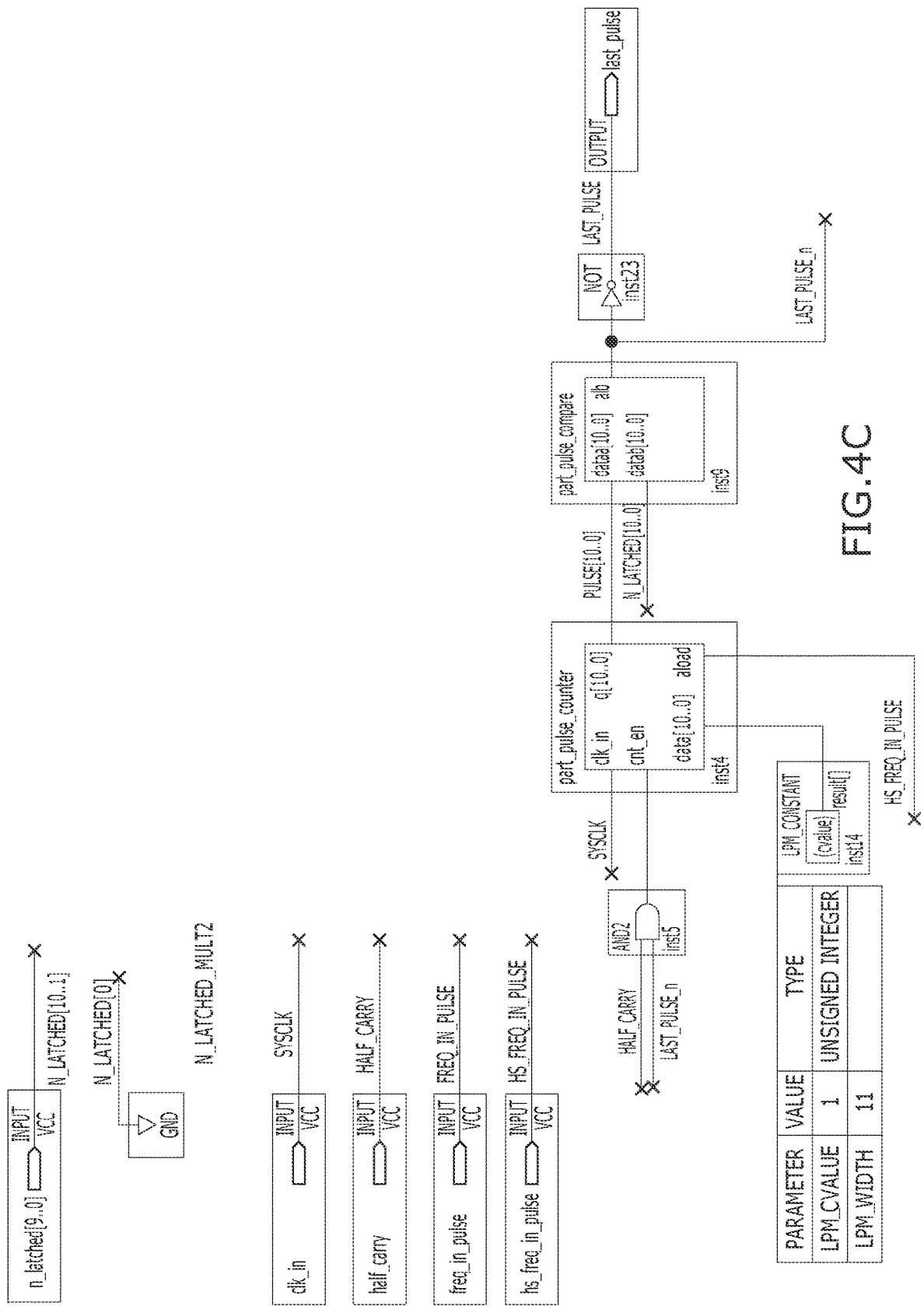
FIG. 4C is a continuation of FIG. 4B.

FIGS. 4A, 4B, and 4C illustrate additional modules including an instant lock divider (part_instant_lock_div) which divides a count of SYSCLKs between FREQ_IN edges (numerator FREQ_CNT from instant_lock_module_design shown on FIG. 2A) by the multiplier N_LATCHED×2 in the denominator, producing a quotient and a remainder. The quotient output is the raw requested number of SYSCLKs per FREQ_OUT transitions (PULSE_REQ) and is converted to the name ADDER_IN [1]. ADDER_IN[1] is input to the parallel adder (part_parallel_add1) in FIG. 4B. A constant (OPERATOR1) is converted to the name ADDER_IN[0]. Although the N value provided is per cycle (including a high period and a low period), the device controls half clocks, so N is multiplied by 2 (i.e., shift left by one binary digit) to generate half-cycles—one high half-cycle and one low half-cycle.

Turning to FIG. 4B, a remainder circuit comprises a remainder counter module (part_remainder_cntr) and a remainder comparator module (part_remainder_compare). The remainder counter module counts up from 1, contributed by a constant (LPM_CONSTANT) shown in FIG. 4B, to the remainder (REMAINDER[ ]) determined in FIG. 4A. FREQ_IN_PULSE latches a 1 in the remainder counter (part_remainder_cntr) which counts remainder clocks AND adds 1 clock per PULSE_REQ. Part_remainder_cntr is count enabled by a half carry (HALF_CARRY) or an output of A less than or equal to B (ALEB). The remainder is distributed (or "hid") between output pulses by changing the least significant bit (LSB) of the bus OPERATOR1[22 . . . 1] (OPERATOR1[0]) between 1 and 0. OPERATOR1 [22 . . . 1] is provided by a constant (LPM_CONSTANT) as shown in FIG. 4A and is equal to zero. The remainder value is added to the output pulse (PULSE_REQ_RESULT; one system clock/FREQ_OUT transition) at part_instant_add_sub until the remainder is exhausted, i.e., the count of the remainder (REMAINDER[ ]) IS EQUAL to the output of part_remainder_cntr[ ]. In other words, the remainder is used to add one PULSE_REQ clock. As a result, some FREQ_OUT transitions are longer by one system clock period (1/SYSCLK) than others. OPERATOR1[ ] bits are zero except for the A less than or equal to B (ALEB) output from the remainder compare module (part_remainder_compare module) renamed OPERATOR1[0]. ALEB stops the count (i.e., it stops the component part_remainder_cntr from counting) and clears bit OPERATOR1[0].

A parallel addition component (part_parallel_add1) adds one remainder bit, i.e., one system clock delay per FREQ_OUT transition, into the original count request of FIG. 4A per half carry while ALEB (converted to OPERATOR1[0] and input to the parallel add component) is high, producing a PULSE_REQ_RESULT that uses up or "hides" the remainder. When the remainder is exhausted, 0 is added to the count request value. The second level instant register (part_instant_register2) locks the pulse request result into a pulse request output every half cycle.

FIG. 4C illustrates a last pulse circuit comprising a pulse counter (part_pulse_counter) and a pulse comparator (part_pulse_compare). The last pulse counter counts FREQ_OUT transitions from 1 (provided as a constant) until the last FREQ_OUT transition, i.e., PULSE[ ]=N_LATCHED[ ] shifted. The pulse compare compares the count to the N_LATCHED value and prevents generation of further pulses once the last pulse (LAST_PULSE) has been produced.

Figure 5A:
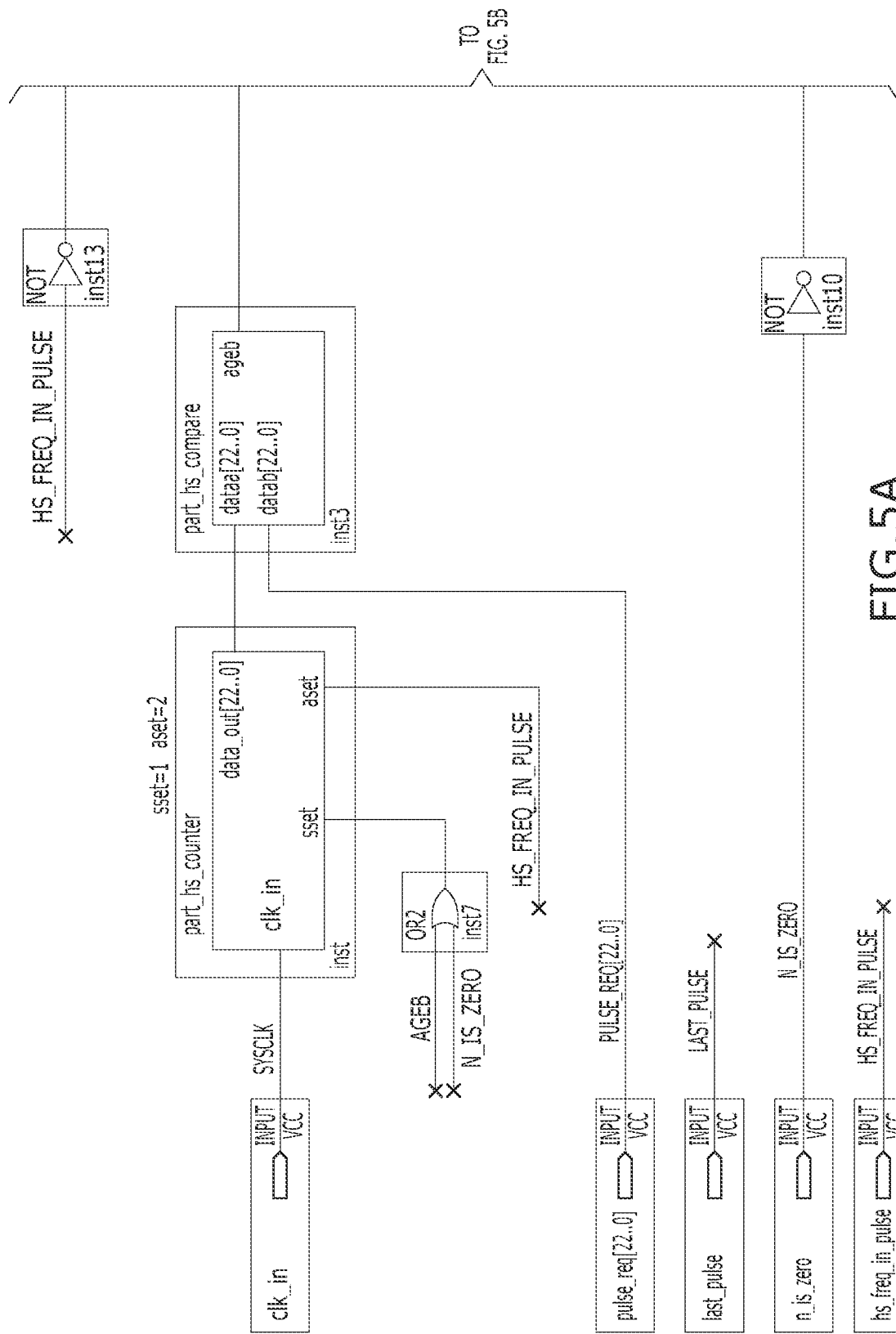
FIG. 5A is a schematic diagram of a high-speed counter comparator module thereof.
Figure 5B:
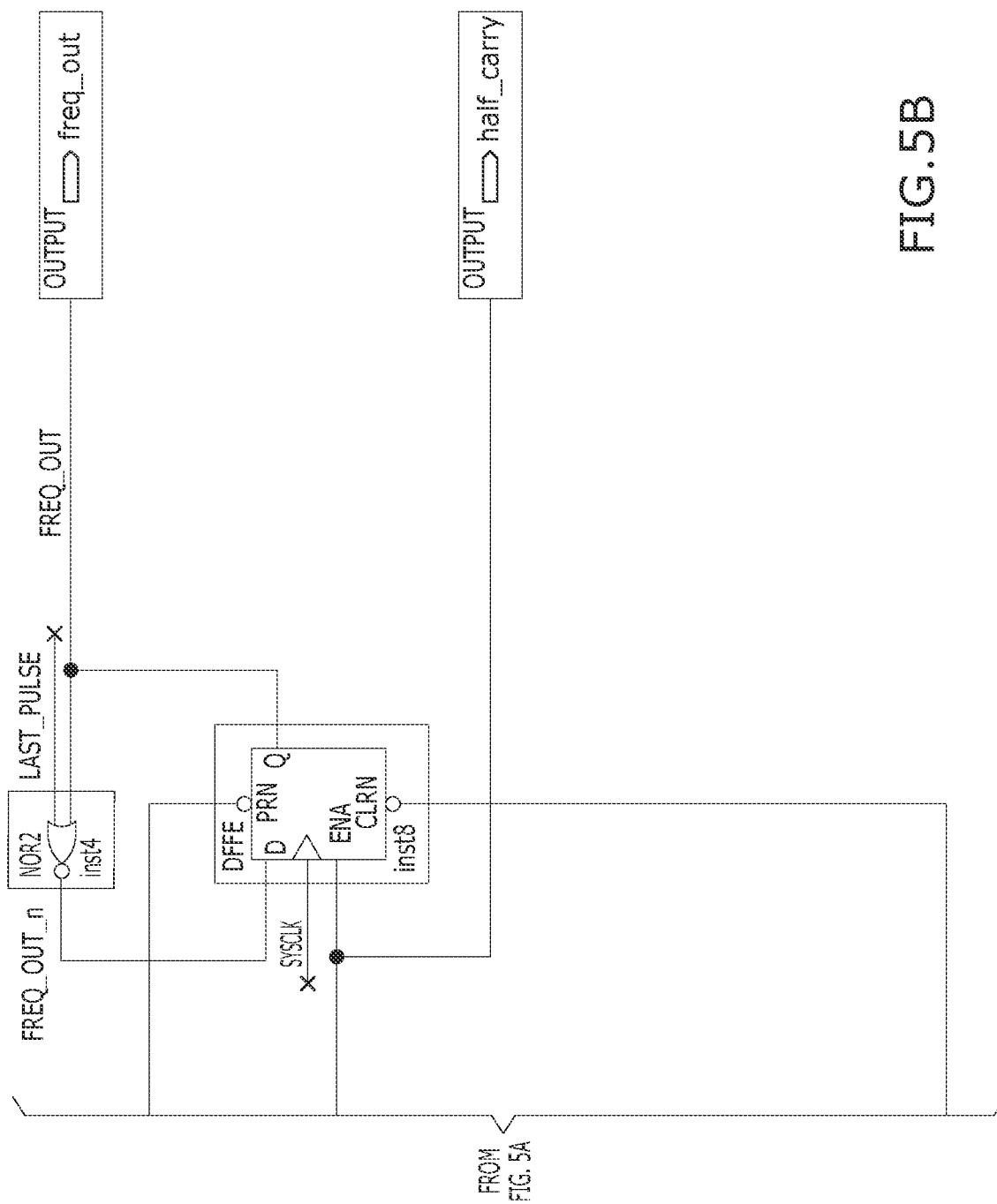
FIG. 5B is a continuation thereof.

FIGS. 5A and 5B illustrate a count comparator module including a high-speed counter (part_hs_counter) and a high-speed comparator (part_hs_compare). The high-speed counter counts SYSCLKs from the top_level module until the high-speed compare (part_hs_compare) determines the pulse request (PULSE_REQ[ ]) is satisfied; in other words, PULSE_REQ[ ]>=part_hs_counter[ ]. It then generates a half carry (HALF_CARRY) enabling the flip-flop DFFE and toggling D and Q for the next transition, high to low and low to high. The counter is reset to 1 by A greater than or equal to B (AGEB) or N_IS_ZERO, or to 2 by HS_FREQ_IN_PULSE (FREQ_IN asynchronous edge pulse). Note sset and aset have different non-zero values. The high-speed frequency input pulse (HS_FREQ_IN_PULSE) sets the counter aset to 2 and A is greater than B AGEB, when high, sets the counter sset to 1 (for timing).

AGEB toggles the output frequency (FREQ_OUT) from 1 to 0 or 0 to 1; see FIG. 5B. The high-speed frequency in pulse (HS_FREQ_IN_PULSE) automatically presets DFFE Q to high output, aligning the output to the leading edge of an incoming pulse, synchronizing output to the input frequency. The enabled D flip-flop inverter DFFE is reset by N_IS_ZERO. Frequency out (FREQ_OUT) is delivered to the workbench shown in FIG. 1 which emits the frequency to the connected device. LAST_PULSE prevents the phase locked loop from emitting excess pulses.

Figure 6:
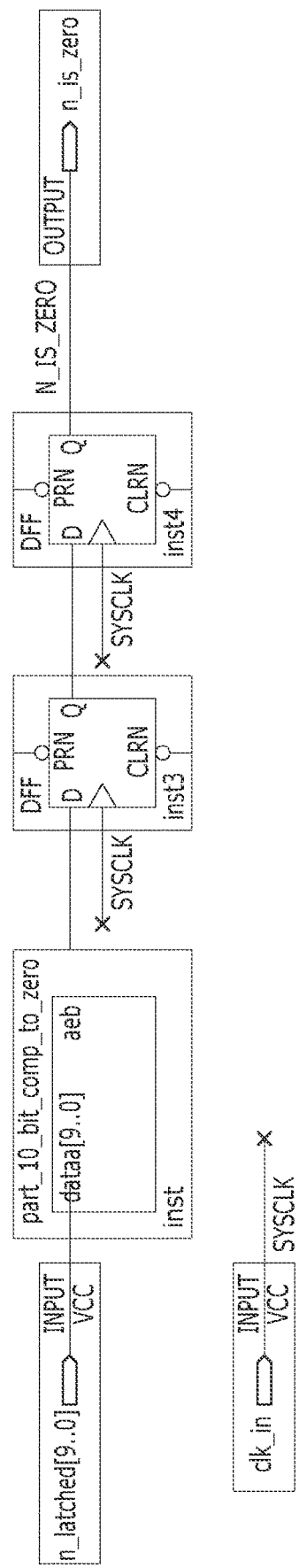
FIG. 6 is a schematic diagram of a zero detect module thereof.

FIG. 6 illustrates a 10-bit compare to zero component (part_10_bit_comp_to_zero) of the zero detect module shown in FIG. 2B which checks if the value of N equals zero. If N_LATCHED[ ] is zero, N_IS_ZERO is asserted and a N_IS_ZERO signal is output. Flip-flops inst3 and inst4 synchronize the pulse separated by two system clocks SYSCLK.

Throughout the process, when the latched N data is all zero (low), an N_IS_ZERO signal is generated from the compare to zero component (part_10_bit_comp_to_zero) and distributed to all modules that may be reset, N=0 (N_IS_ZERO) is asserted to hold FREQ_OUT low, the circuit shuts down, providing a power-saving mode. Consequently, any device controlled by the circuit shuts down as well. See also FIG. 2B.

Figure 7:
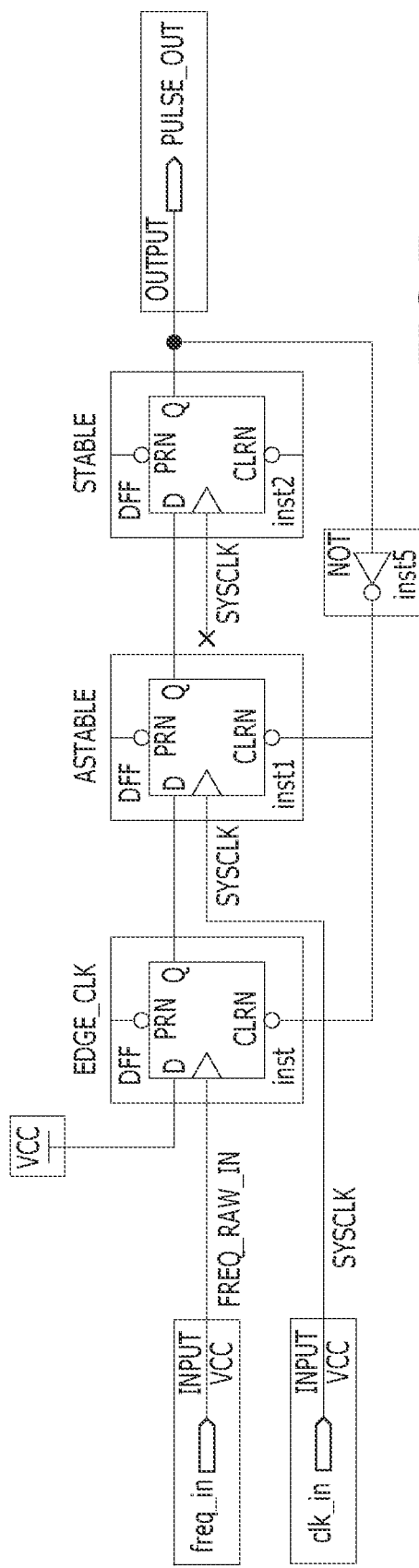
FIG. 7 is a schematic diagram of a pulse generator module thereof.

FIG. 7 illustrates the pulse generator (pulse_giver) which synchronizes the leading edge of frequency-in to an outgoing pulse (PULSE_OUT). It generates synchronous pulses FREQ_IN_PULSE and HOLD pulse using edge clock (EDGE_CLK), ASTABLE and STABLE DFFs and is instantiated twice on FIG. 2A. The EDGE_CLK flip-flop is edge triggered and holds the leading edge of the input frequency, immediately flipping Q to 1. The ASTABLE flip-flop acts as a synchronizer, managing incoming pulses that occur in a transition period between system clock pulses, i.e., a clock pulse may occur in the midst of an incoming pulse, while the STABLE flip-flop is synchronized with the system clock. When the system clock's leading edge occurs exactly at the same time as the leading edge of the input frequency, the output of ASTABLE DFF is indeterminate (i.e., may start high and fall low, may stay low or may start low and go high). The STABLE DFF is always in a stable state and generates one pulse synchronized to SYSCLK. The output FREQ_IN_PULSE is delivered to the workbench for diagnostic purposes and is used to clear a diagnostic counter (part_wb_fre_out_cntr) shown in FIG. 1.

Figure 8:
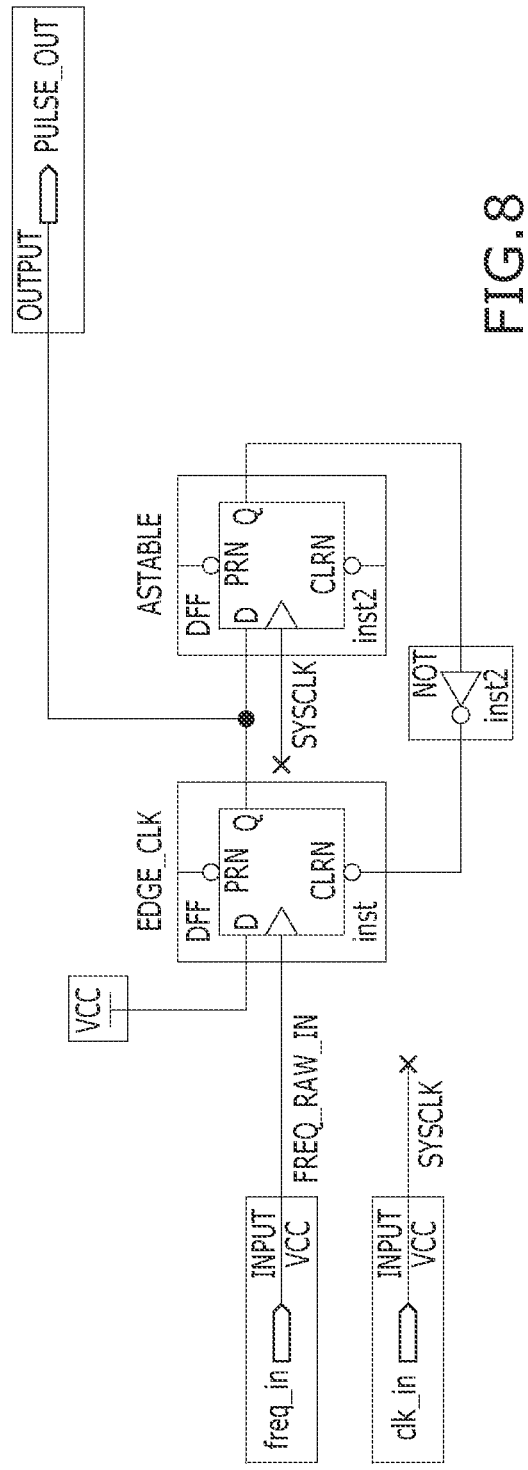
FIG. 8 is a schematic diagram of a high-speed pulse generator module thereof.

FIG. 8 illustrates a high-speed pulse generator (hs_pulse_giver) that generates a high-speed asynchronous pulse (HS_FREQ_IN_PULSE) from the leading edge of an incoming pulse freq_in to get a high-speed lock using EDGE_CLK and ASTABLE DFFs. The absence of a STABLE DFF enables generation of an output PULSE_OUT in about a nanosecond to be executed immediately to output FREQ_OUT. Refer to FIG. 5B at the preset of the enabled D flip-flop.

Figure 9:
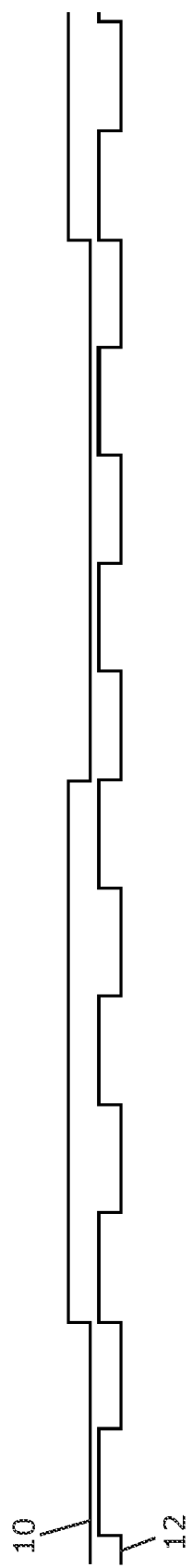
FIG. 9 is a timing diagram illustrating a frequency output locked to a frequency input.

As shown in FIG. 9, a timing diagram illustrates an example of output frequency locked to an input frequency by the system disclosed in FIGS. 1-8. In this example, five cycles of frequency output (12) are generated for each cycle of frequency input (10), i.e., N=5.

Figure 10:
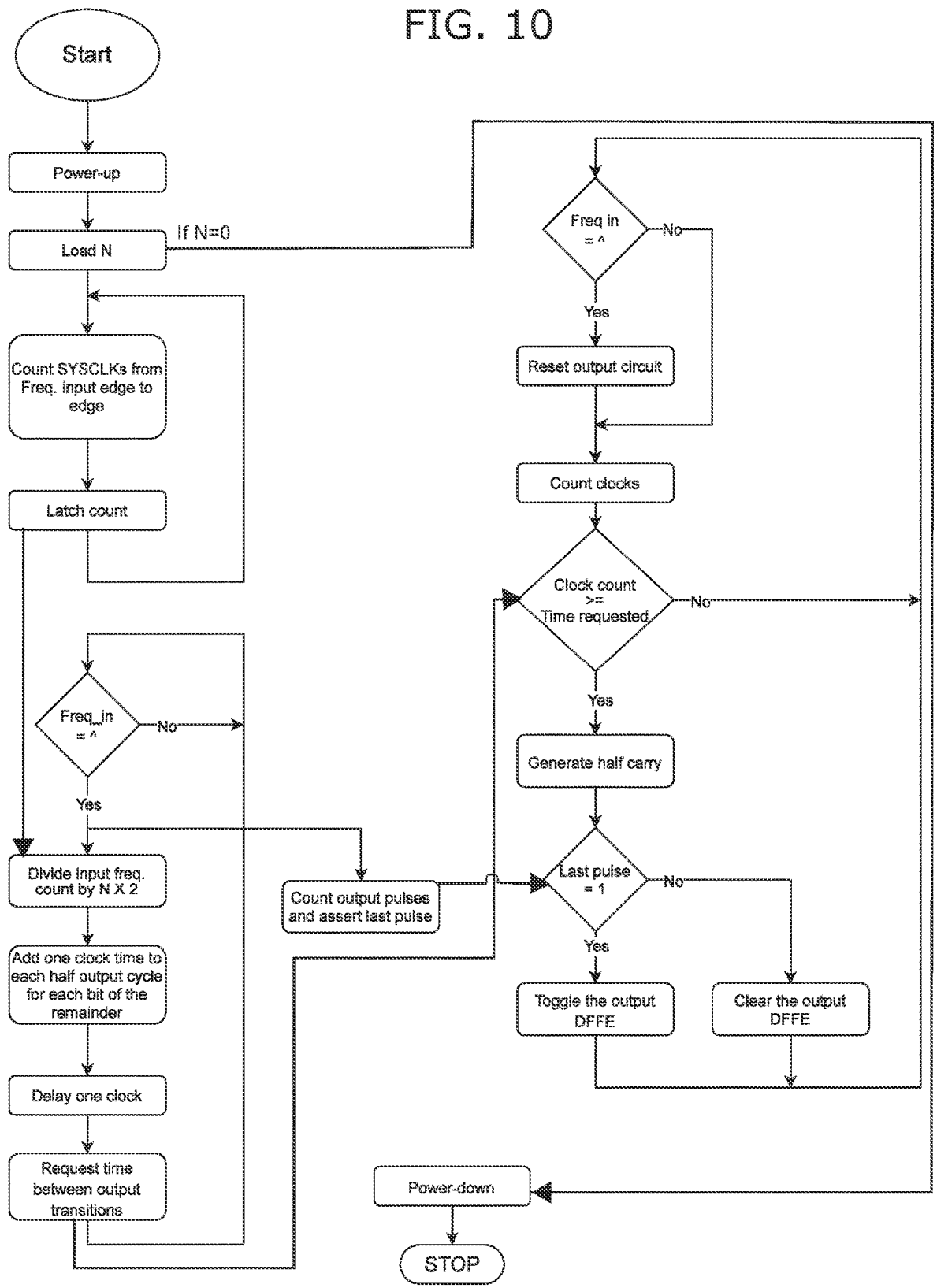
FIG. 10 is a flowchart illustrating a method of performing a low-frequency phase-locked loop with a high-density logic device according to an embodiment of the present invention.

FIG. 10 is a flow diagram of an example embodiment of a method for a low-frequency phase-locked loop on a high density logic chip. Several steps of the method run simultaneously and sequentially. The method begins with a first cycle that loads an N value, counts SYSCLKS from the leading edge of the frequency input, and latches the count. The latched count is input into a second intity that divides the input frequency count by 2N and distributes the remainder among the resulting pulses. The second intity also counts the output pulses and stops the output pulses once last pulse has been asserted. Further, the second intity delays one clock and requests time between output transitions (the single cycle delay allows the LFPLL to output FREQ_OUT based on the preceding FREQ_IN cycle). A third intity counts clocks when a frequency in pulse is detected, generating a half carry when the clock count exceeds the time requested in the second intity. The DFFE is allowed to toggle until last pulse is asserted, then the DFFE is prevented from toggling high. The method ends when the N value is zero or the chip powers down.

It should be understood, of course, that the foregoing relates to exemplary embodiments of the invention and that modifications may be made without departing from the spirit and scope of the invention as set forth in the following claims.

What is claimed is:

1. A high-density logic circuit device low-frequency phase-locked loop system, comprising:
   a digital logic input-output module operative to receive an input frequency and to transmit an output frequency;
   an internal clock;
   an instant lock module connected to the digital logic input-output module and operative to lock the output frequency in phase to a leading edge of the input frequency within two internal propagation delays;
   an instant adjust error module connected to the digital logic input-output module and operative to emit a pulse request until a last pulse is identified;
   a high-speed count comparator comprising a high-speed counter and a high-speed comparator, said high-speed count comparator connected to the digital logic input-output module and the instant adjust error module and operative to receive the pulse request and to emit the output frequency;

a multiplication factor-is-zero-state detect module connected to the instant lock module and the high-speed count comparator, said multiplication factor-is-zero-state detect module having a reset function;

a pulse generator connected to the digital logic input-output module, the instant lock module, and the instant adjust error module, and operative to receive the input frequency and internal clock pulses and to output a frequency-in pulse to the instant lock module and the instant adjust error module; and a high-speed pulse generator connected to the digital logic input-output module, the high-speed count comparator, the instant lock module, and the instant adjust error module, and operative to receive the input frequency and the internal clock pulses and to output a high-speed frequency-in pulse to the high-speed count comparator, the instant lock module, and the instant adjust error module.

2. The high-density logic circuit device low-frequency phase-locked loop system of claim 1, further comprising a pulse counter having inputs coupled to the internal clock, the high-speed count comparator, the instant lock module, and the instant adjust error module; and an output coupled to a pulse comparator that is operative to assert last pulse.

3. The high-density logic circuit device low-frequency phase-locked loop system of claim 1, further comprising an overflow flip-flop having inputs coupled to the internal clock and the high-speed counter and an output coupled to the digital logic input-output module.

4. The high-density logic circuit device low-frequency phase-locked loop system of claim 1, further comprising a first register operative to latch a multiplier value obtained from the digital logic input-output module, wherein the multiplication factor-is-zero-state detect module delivers a reset signal to the digital logic input-output module when the multiplier value is zero.

5. The high-density logic circuit device low-frequency phase-locked loop system of claim 4, wherein the digital logic input-output module further comprises a dip switch simulator operative to generate the multiplier value.

6. The high-density logic circuit device low-frequency phase-locked loop system of claim 4, further comprising a reset pulse generator operative to deactivate the high-density logic circuit device upon receiving a reset signal from the digital logic input-output module.

7. The high-density logic circuit device low-frequency phase-locked loop system of claim 4, further comprising:
a) an instant lock divider having inputs coupled to the first register and a second register, said instant lock divider being operative to generate a quotient and a remainder with a frequency count as a numerator and the multiplier value as a denominator and having an output coupled to a remainder comparator;
b) a parallel adder having an input coupled to the instant lock divider and the remainder comparator and an output coupled to a second register; and
c) a remainder counter having an input coupled to the internal clock and the high-speed count comparator and an output coupled to the remainder comparator.

8. A method of performing a low-frequency phase-locked loop with a high-density logic device, comprising:
a) receiving a binary multiplier value;
b) receiving an input frequency;
c) generating a reference clock signal;
d) generating a high-speed pulse responsive to a first leading edge of the input frequency and to the reference clock signal;
e) locking an output frequency to the first leading edge of the input frequency within two internal propagation delays;
f) counting reference clock signals between the first leading edge of the input frequency and a second leading edge of the input frequency;
g) latching the binary multiplier value;
h) dividing the counted reference clock signals by the latched binary multiplier value to produce a quotient and a remainder;
i) generating a pulse request from the quotient and the remainder;
j) generating output pulses;
k) counting the output pulses and comparing the count to the pulse request; and
l) toggling a flip-flop when the count is equal to or greater than the pulse request.

9. The method of performing a low-frequency phase-locked loop of claim 8, further comprising generating an overflow signal when no input frequency is received within a predetermined amount of time.

10. The method of performing a low-frequency phase-locked loop of claim 8, further comprising powering off the low-frequency phase-locked loop in a power-saving mode.

11. The method of performing a low-frequency phase-locked of claim 10, further comprising restarting the phase-locked loop upon receiving the input frequency.

* * * * *